(12) United States Patent
Bateman

(10) Patent No.: US 9,570,459 B2
(45) Date of Patent: Feb. 14, 2017

(54) VERTICAL GATE NAND MEMORY DEVICES

(71) Applicant: Unity Semiconductor Corporation, Sunnyvale, CA (US)

(72) Inventor: Bruce Lynn Bateman, Fremont, CA (US)

(73) Assignee: UNITY SEMICONDUCTOR CORPORATION, Sunnyvale, CA (US)

(*) Notice: Subject to any disclaimer, the term of this patent is extended or adjusted under 35 U.S.C. 154(b) by 0 days.

(21) Appl. No.: 14/314,622

(22) Filed: Jun. 25, 2014

(65) Prior Publication Data

US 2015/0014760 A1    Jan. 15, 2015

Related U.S. Application Data

(60) Provisional application No. 61/844,555, filed on Jul. 10, 2013.

(51) Int. Cl.
| | |
|---|---|
| *H01L 29/76* | (2006.01) |
| *H01L 27/115* | (2006.01) |
| *H01L 29/66* | (2006.01) |
| *H01L 29/792* | (2006.01) |
| *G11C 16/04* | (2006.01) |
| *G11C 16/34* | (2006.01) |

(52) U.S. Cl.
CPC ..... *H01L 27/11582* (2013.01); *G11C 16/0483* (2013.01); *G11C 16/3418* (2013.01); *H01L 27/11551* (2013.01); *H01L 27/11578* (2013.01); *H01L 29/66833* (2013.01); *H01L 29/7926* (2013.01)

(58) Field of Classification Search
CPC .. H01L 27/115; H01L 29/78; H01L 27/11582; H01L 29/66833; H01L 29/7926; H01L 27/11551; H01L 27/11578; G11C 16/0483; G11C 16/3418

See application file for complete search history.

(56) References Cited

U.S. PATENT DOCUMENTS

| | | | |
|---|---|---|---|
| 8,599,616 B2* | 12/2013 | Roizin | H01L 29/7926 257/E21.09 |
| 2008/0242008 A1* | 10/2008 | Mokhlesi | H01L 27/115 438/129 |
| 2011/0205800 A1 | 8/2011 | Roohparvar | |
| 2011/0292731 A1 | 12/2011 | Kim et al. | |
| 2012/0032245 A1 | 2/2012 | Hwang et al. | |

(Continued)

OTHER PUBLICATIONS

Kim et al., "Multi-Layered Vertical Gate NAND Flash Overcoming Stacking Limit for Terabit Density Storage," 2009 VLSI Symposium on VLSI Technology Digest of Technical Papers, Jun. 16-18, 2009, pp. 188-189. 2 pages.

(Continued)

*Primary Examiner* — Daniel Luke
*Assistant Examiner* — Khatib Rahman
(74) *Attorney, Agent, or Firm* — Lowenstein Sandler LLP

(57) ABSTRACT

In an example, a device comprises a vertical stack of memory cells. Each memory cell of the vertical stack may include more than one memory element. A first vertical gate line may be coupled to a first one of the memory elements in each memory cell, and a second vertical gate line may be coupled to a second one of the memory elements in each memory cell. The first vertical gate line may be electrically isolated from the second vertical gate line.

10 Claims, 12 Drawing Sheets

(56) References Cited

U.S. PATENT DOCUMENTS

| | | | |
|---|---|---|---|
| 2013/0099306 A1* | 4/2013 | Choi | H01L 29/66833 257/329 |
| 2013/0170303 A1* | 7/2013 | Ahn | H01L 29/66833 257/329 |
| 2013/0307047 A1* | 11/2013 | Sakuma | H01L 29/66825 257/316 |

OTHER PUBLICATIONS

Kim et al., "Three-Dimensional nand Flash Architecture Design Based on Single-Crystalline Stacked ARray," IEEE Transactions on Electron Devices, vol. 59, No. 1, pp. 35-45, Jan. 2012. 11 pages.

Lue et al., "A Highly Scalable 8-Layer 3D Vertical-Gate (VG) TFT NAND Flash Using Junction-Free Buried Channel BE-SONOS Device," 2010 Symposium on VLSI Technology, Jun. 15-17, 2010, pp. 131-132. 2 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), pp. 1-4, May 22-25, 2011. 4 pages.

Whang et al., "Novel 3-dimensional Dual Control-gate with Surrounding Floating-gate (DC-SF) NAND flash cell for 1Tb file storage application," 2010 IEEE International Electron Devices Meeting (IEDM), pp. 29.7.1-29.7.4, Dec. 6-8, 2010. 4 pages.

* cited by examiner

VERTICAL GATE NAND MEMORY DEVICES

CROSS-REFERENCE TO RELATED APPLICATIONS

This application is a non-provisional of U.S. Provisional Application No. 61/844,555 filed on Jul. 10, 2013 entitled VERTICAL GATE NAND MEMORY DEVICES and is incorporated by reference herein in its entirety.

COPYRIGHT NOTICE

© 2013 Rambus, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all rights whatsoever available under 37 CFR §1.71(d).

BACKGROUND

In order to address scalability issues associated with planar NAND flash, vertical NAND flash structures have been developed. In one known vertical NAND flash structure, the NAND gate is run vertically to achieve a relatively small cell footprint. However, some applications demand an even smaller cell footprint for a given amount of memory than provided by the known vertical NAND flash structure.

DETAILED DESCRIPTION

Figure 1A:
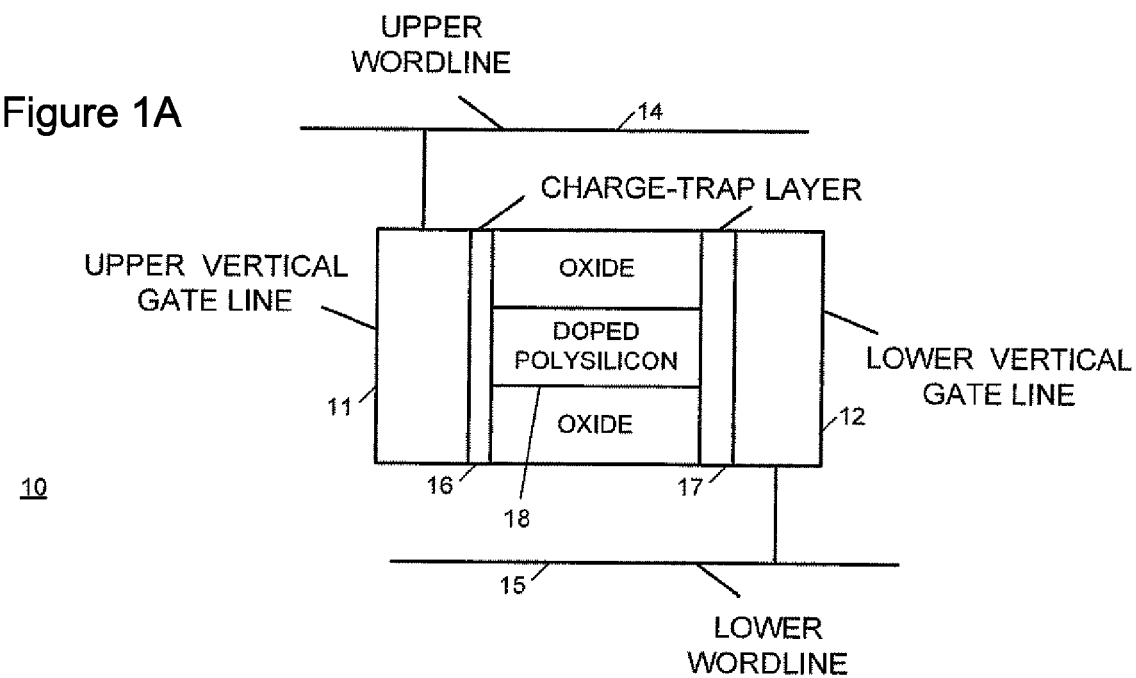
FIG. 1A is a simplified cross-section diagram showing a vertical gate NAND memory cell.

FIG. 1A is a simplified cross-section diagram showing a vertical gate NAND memory cell.

The vertical gate NAND memory cell 10 includes a first vertical gate line 11 electrically coupled to an upper word line 14, and a second vertical gate line 12 electrically coupled to a lower horizontal word line 15 that is electrically isolated from the upper horizontal word line 14.

The vertical gate NAND memory cell includes more than one NAND memory element, e.g. two separately accessible NAND memory elements as per the illustrated example. A first one of the separately accessible NAND memory elements comprises a portion of the charge trap layer 16 and a portion of the doped polysilicon layer 18. A second one of the NAND memory elements comprises a portion of the charge trap layer 17 and a portion of the doped polysilicon layer 18.

Figure 1B:
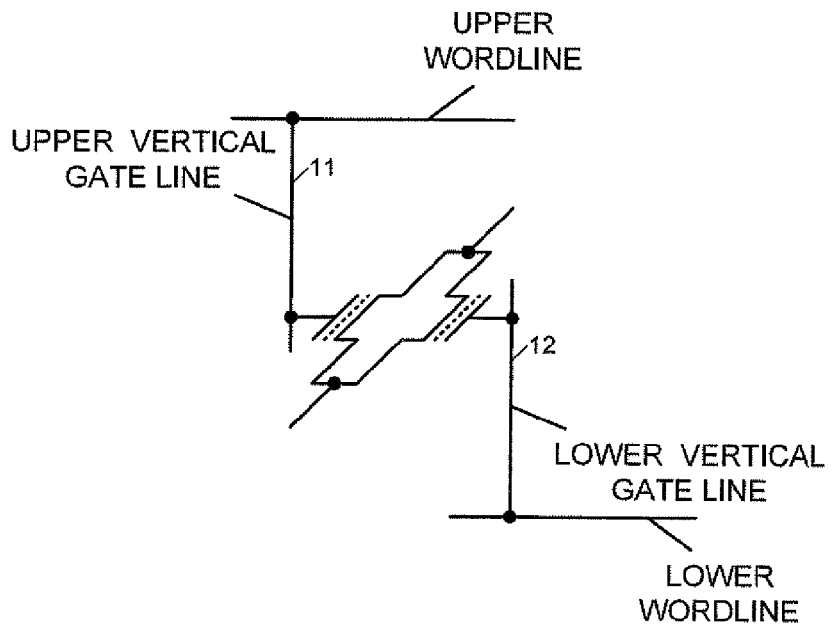
FIG. 1B is a circuit diagram showing the vertical gate NAND memory cell of FIG. 1A.

FIG. 1B is a circuit diagram showing the vertical gate NAND memory cell of FIG. 1A. The circuit diagram shows a gate terminal corresponding to the first NAND memory element electrically coupled to the vertical gate line 11, and a gate terminal corresponding to the second NAND memory element electrically coupled to the vertical gate line 12.

Figure 2:
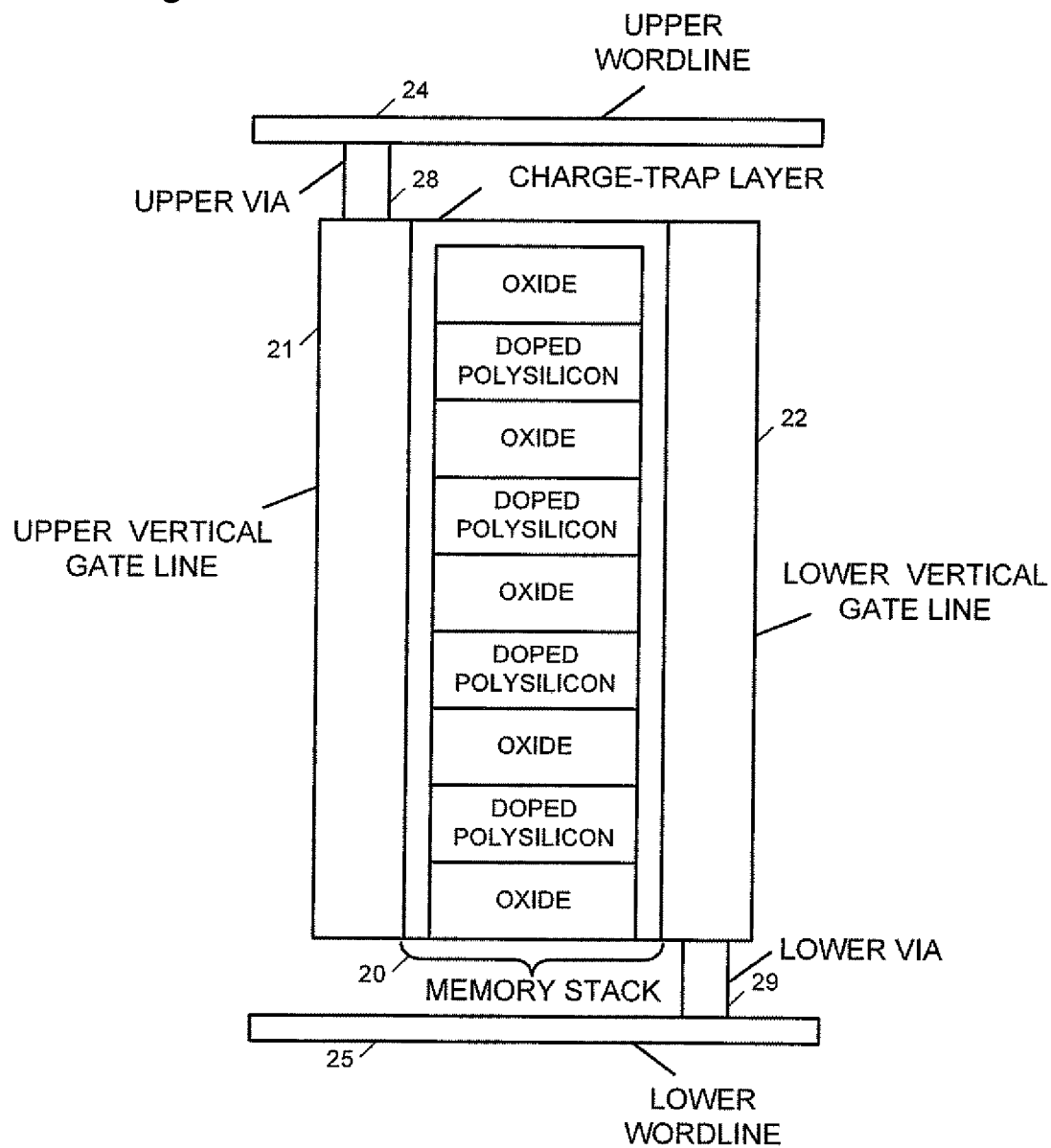
FIG. 2 is a simplified cross-section diagram showing a vertical memory stack including multiple vertical gate NAND memory cells shown in FIG. 1A.

FIG. 2 is a simplified cross-section diagram showing a vertical memory stack including multiple vertical gate NAND memory cells shown in FIG. 1A.

The vertical memory stack 20 comprises a plurality of vertical gate NAND memory cells. In the illustrated example, the plurality of vertical gate NAND memory cells comprises four vertical gate NAND memory cells for ease of illustration; however, it should be understood that any number of memory cells may be included in a stack. In the stacked memory device, the gate lines 21 and 22 are connected to the word lines 24 and 25 by the vias 28 and 29, respectively.

Figure 3A:
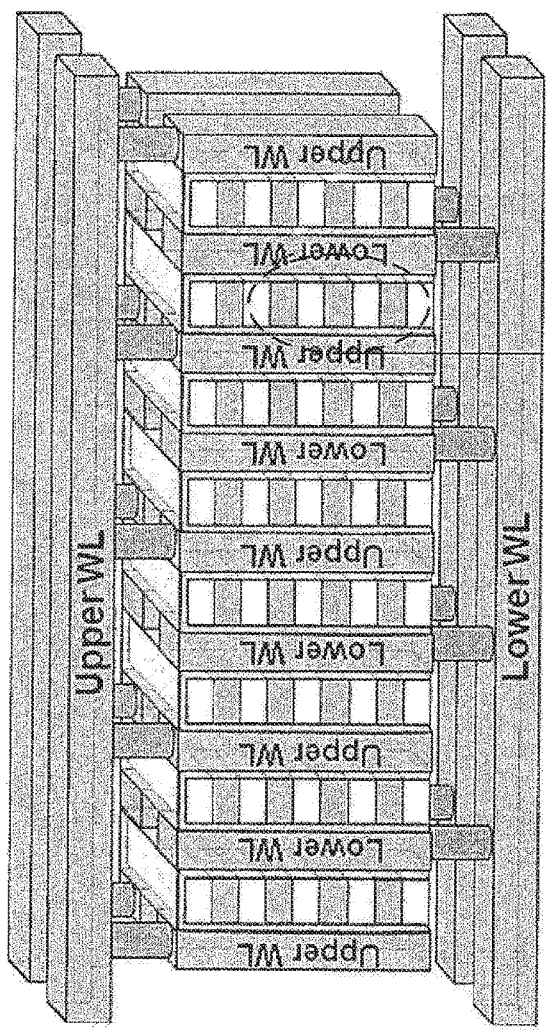
FIG. 3A is a perspective simplified cross-section diagram showing a stacked memory device including multiple vertical memory stacks shown in FIG. 2.
Figure 3B:
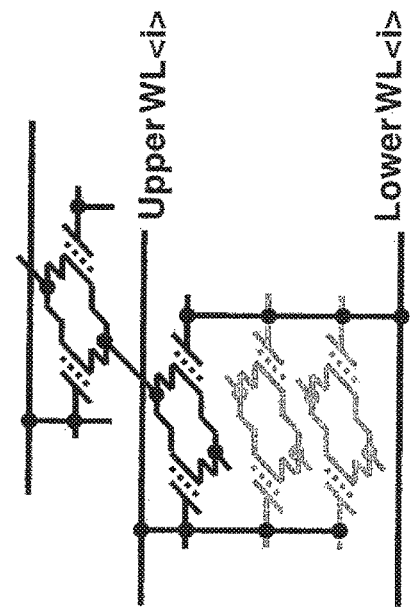
FIG. 3B is a circuit diagram showing the stacked memory device of FIG. 3A.

FIG. 3A is a perspective simplified cross-section diagram showing a stacked memory device including multiple vertical memory stacks shown in FIG. 2. The stacked memory device 30 includes multiple of the vertical memory stacks 20 of FIG. 2. FIG. 3B is a circuit diagram showing a portion of the stacked memory device of FIG. 3A.

Figure 4:
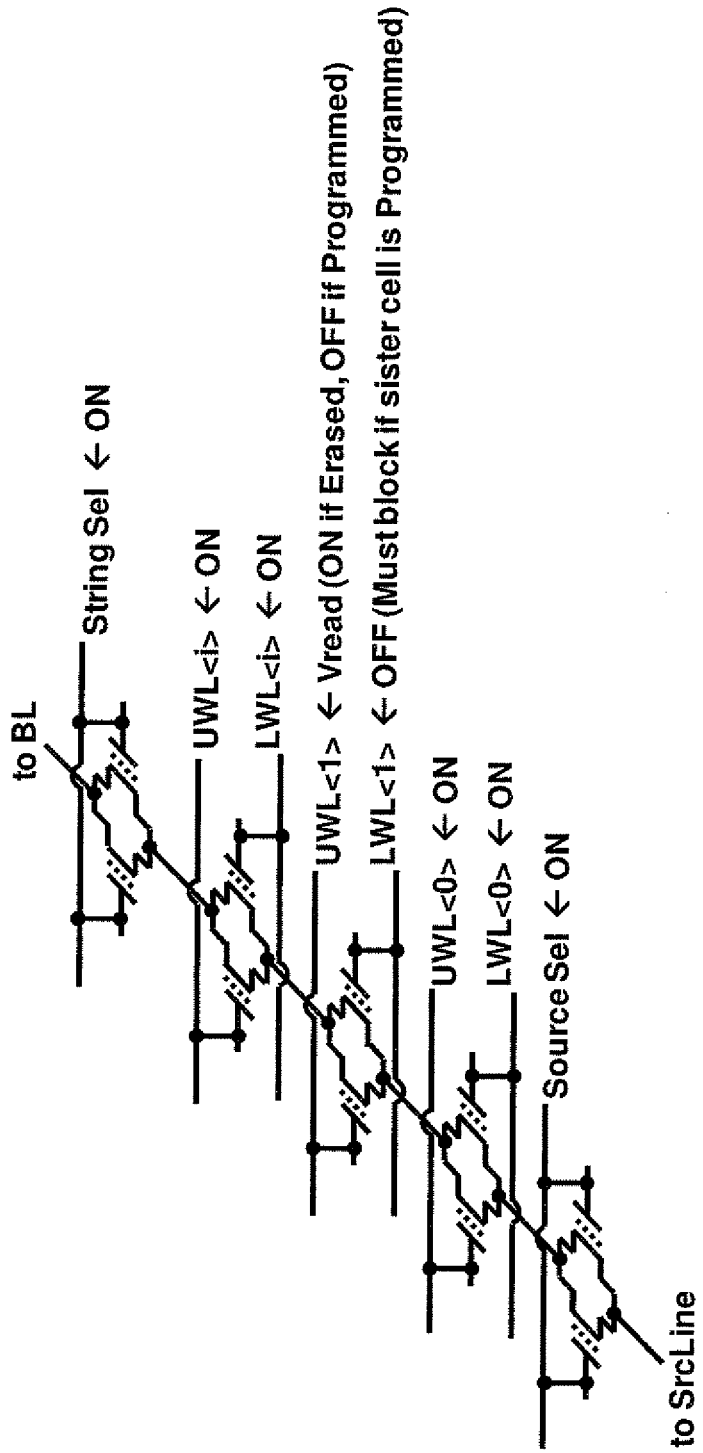
FIG. 4 is a circuit diagram showing memory access operations for a selected string of a stacked memory device represented, e.g., by the configuration of FIG. 3A.

FIG. 4 is a circuit diagram showing memory access operations for a selected string of a stacked memory device represented, e.g., by the configuration of FIG. 3A.

The circuit diagram illustrates a memory access to data in one layer of a vertical memory stack, the data located in a horizontal string of tandem memory cells crossing the same layer in a horizontally adjacent line of vertical memory stacks. During a memory access operation on the memory string, any unselected memory cells of stacks other than the selected stack in the memory string have their respective memory elements turned on by voltages on vertical gate lines coupled to the unselected memory cells. A selected memory cell in the selected stack in the memory string is configured to have an unselected memory element turned off and a selected memory element set to a memory access voltage by voltages on vertical gate lines coupled to the respective memory elements of the selected memory cell.

Figure 5A:
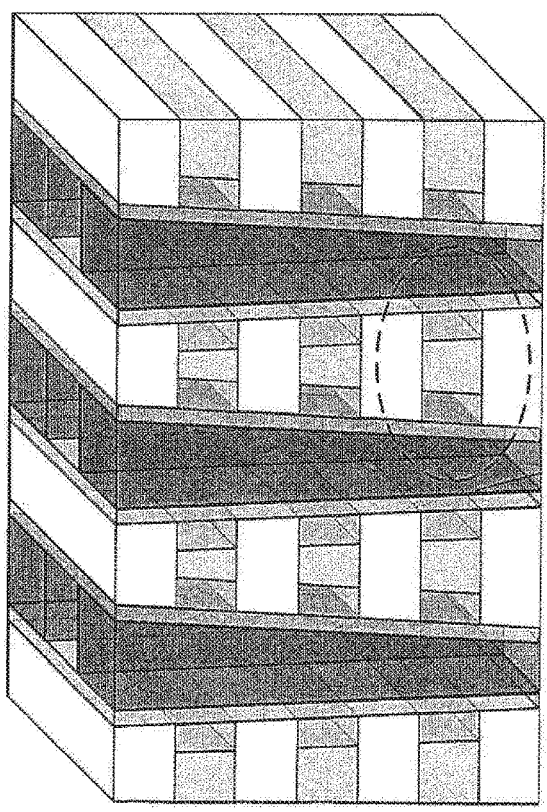
FIG. 5A is a block diagram showing a stacked memory device with isolated horizontal channel tracks.
Figure 5B:
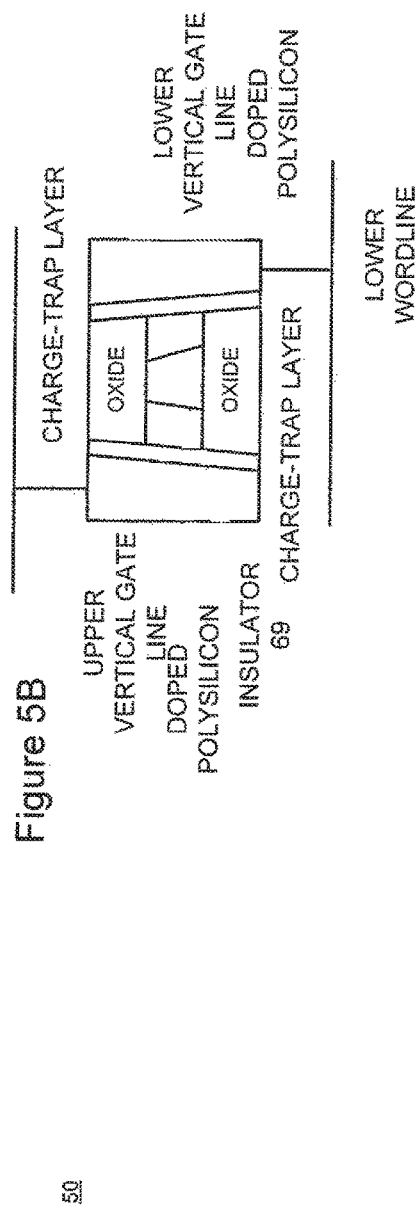
FIG. 5B is a simplified cross-section diagram showing one of the FIG. 5A vertical gate NAND memory cells with two isolated memory devices.

FIG. 5A is a perspective partial device diagram showing a stacked memory device with isolated horizontal channel tracks. The stacked memory device 50 includes vertical stacks of memory cells that each include more than one memory element, and a horizontal insulation structure 69 to electrically isolate the memory elements. FIG. 5B is a simplified cross-section diagram showing one of the FIG. 5A vertical gate NAND memory cells with two isolated memory devices.

As with prior embodiments, the stacked memory device 50 includes vertical gate lines, each coupled to one memory element in each of the two memory cells. In an example, a first vertical gate line is coupled to a first one of the memory elements in each of three vertically aligned memory cells, and a second vertical gate line is coupled to a second one of the memory elements in each of the same three memory cells. The first vertical gate line is electrically isolated from the second vertical gate line.

In an example, a first word line (upper word line) is positioned above the vertical stack of memory cells and horizontally perpendicular to the vertical gate lines, and a second word line (lower word line) is positioned below the vertical stack of memory cells and horizontally perpendicular to the vertical gate lines. The first word line is electrically coupled to a first one of the vertical gate lines, and the second word line is electrically coupled to a second one of the vertical gate lines.

FIG. 5B is a block diagram showing vertical gate NAND memory cell with two isolated memory devices shown in FIG. 5A.

In an example, the memory elements in each of the memory cells are configured to store respective data states. In an example, a first one of the memory elements in each of the memory cells is separately accessible from a second one the memory elements in each of the memory cells. In an example, an insulator 69 is used to electrically isolate the memory elements within a cell.

Figure 5C:
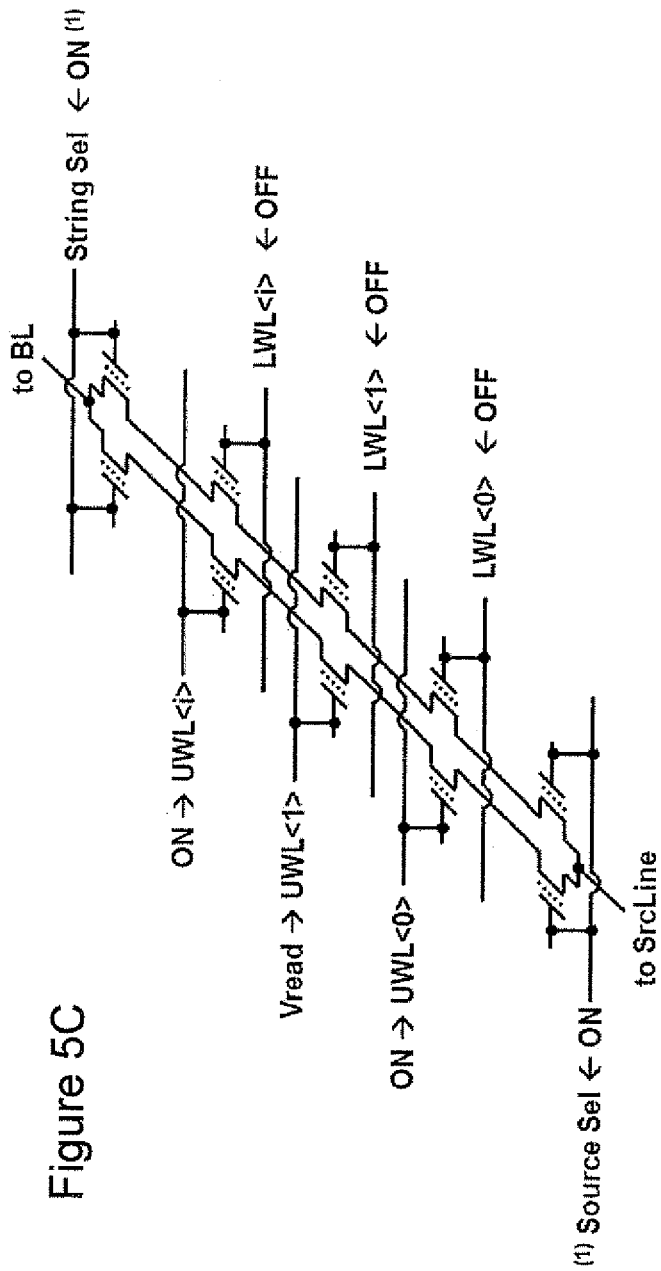
FIG. 5C is a perspective partial device diagram showing memory access operations for one string pair of the stacked memory device with isolated horizontal channel tracks of FIG. 5A.

FIG. 5C is a circuit diagram showing memory access operations for one string pair of the stacked memory device with isolated horizontal channel tracks of FIG. 5A.

The circuit diagram illustrates a memory access to data in one layer of a vertical memory stack of a string of tandem memory cells crossing the same layer in a horizontally adjacent line of vertical memory stacks. During a memory access operation on the memory string, memory elements electrically coupled to the lower word lines are turned off. Unselected memory elements electrically coupled to the upper word lines are turned on by voltages on vertical gate lines coupled thereto. A selected memory element of the memory string is set to a memory access voltage by a voltage on a selected upper word line and a vertical gate coupled thereto.

FIGS. 6A-6I are block diagrams showing an example process for fabricating the vertical gate NAND memory cell with isolated horizontal channel tracks.

Figure 6A:
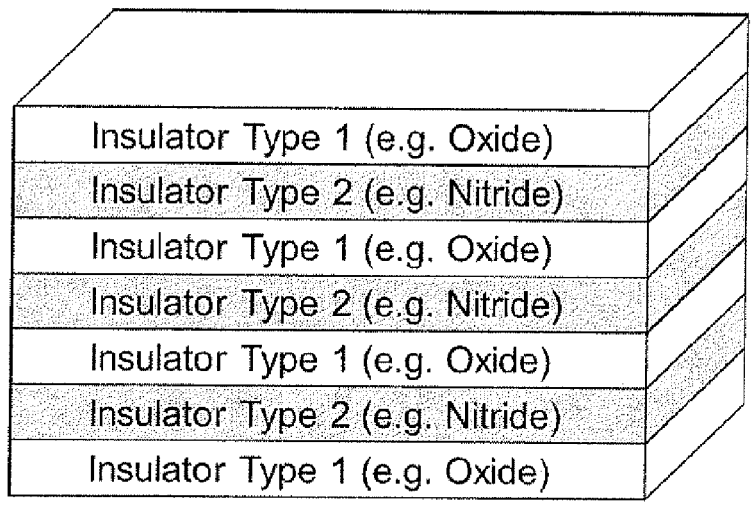
FIGS. 6A-6I are block diagrams showing an example process for fabricating the vertical gate NAND memory cell with isolated horizontal channel tracks.

Referring to FIG. 6A, a first insulator type, e.g. an oxide, may be deposited, and a second insulator type that is different than the first insulator type, e.g. a nitride, may be deposited above a layer of the first insulator type. The process may be repeated any number of times. In an example, the deposition provides a thin film having the first insulation layers interleaved with the second insulation layers.

Figure 6B:
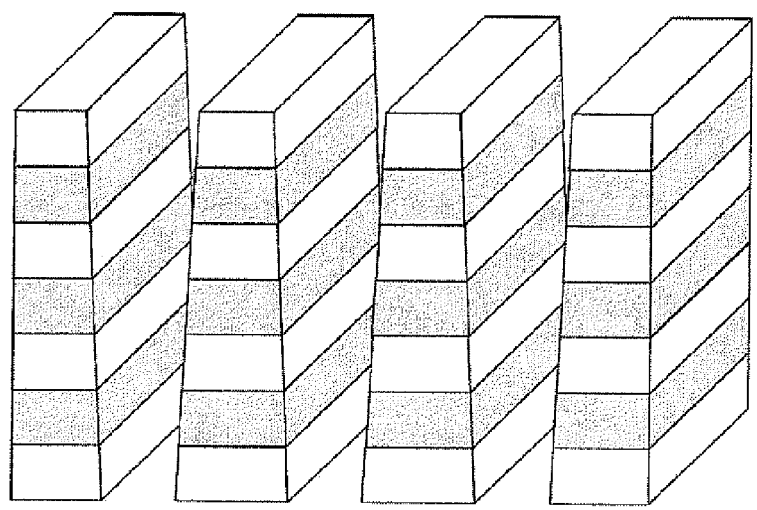

Referring to FIG. 6B, any known process may be used to remove material from the deposited layers in order to form vertical insulation structures having first insulation layers interleaved with second insulation layers. In an example, a trench etch on the thin film is used to form the vertical insulation structures.

Figure 6C:
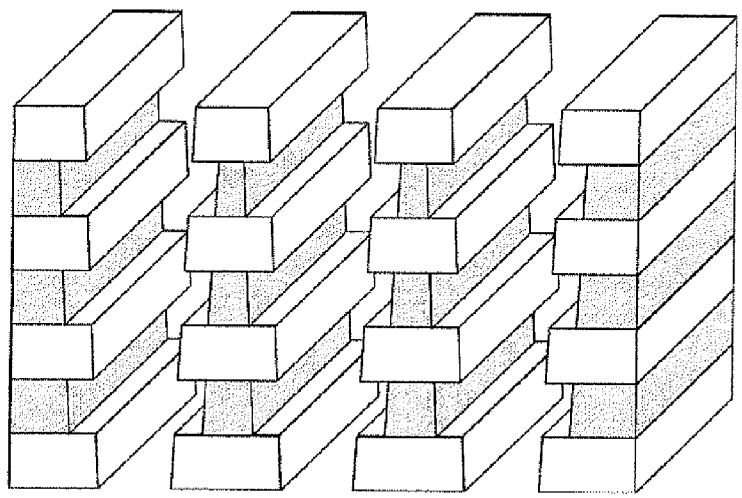

Referring to FIG. 6C, recess channels may be formed in the vertical insulation structures by removing a portion of the second insulator type material. In an example, removal is by performing a recess etch of the vertical insulation structures corresponding to the second insulation layers to form the recess channels in the insulation structures.

Figure 6D:
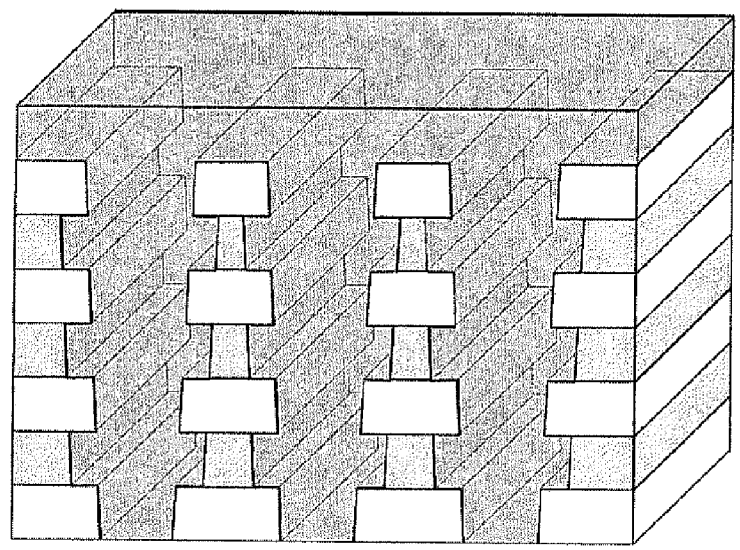

Referring to FIG. 6D, a semiconductive material may be deposited in the recess channels. In an example, polysilicon is deposited between the vertical insulation structures.

Figure 6E:
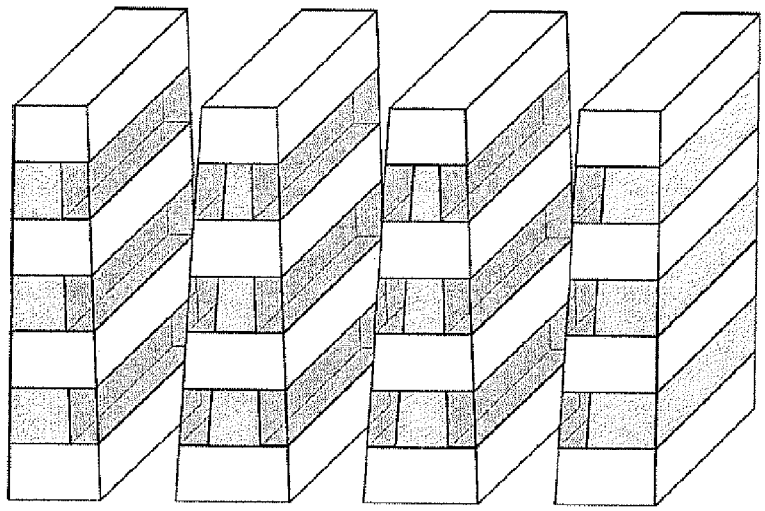

Referring to FIG. 6E, the semiconductive material, e.g. the polysilicon, between the vertical insulation structures may be removed while retaining the semiconductive material, e.g. the polysilicon, in the recess channels. In an example, an anisotropic polysilicon etch is performed to remove the polysilicon from between the vertical insulation structures and to retain the polysilicon in the recess channels.

Figure 6F:
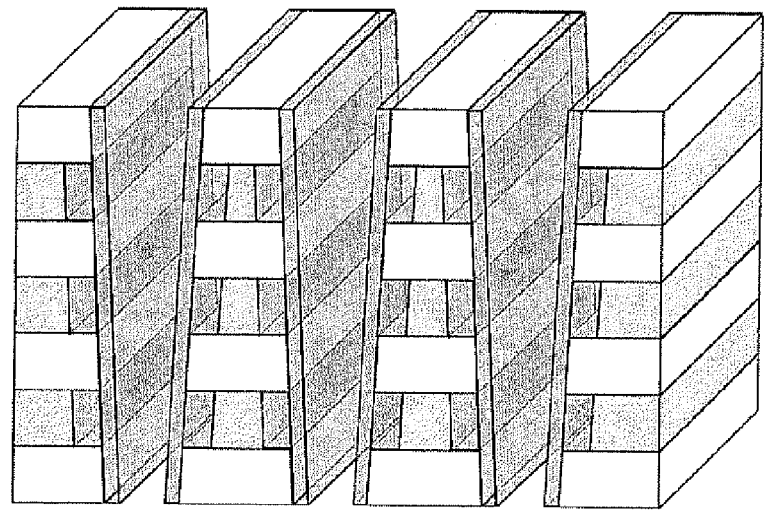

Referring to FIG. 6F, a charge-trap layer may be deposited over the semiconductive material in the recess channels to form vertical stacks of memory elements, each memory element comprising a combination of semiconductive material in one of the recess channels and a portion of the charge-trap layer. In an example, a charge-trap thin film may be deposited over side walls between the vertical insulation structures to form the vertical stacks of memory elements. In an example, the charge-trap layer is an oxide nitride oxide layer, and the memory elements are silicon oxide nitride oxide silicon (SONOS) memory devices.

Figure 6G:
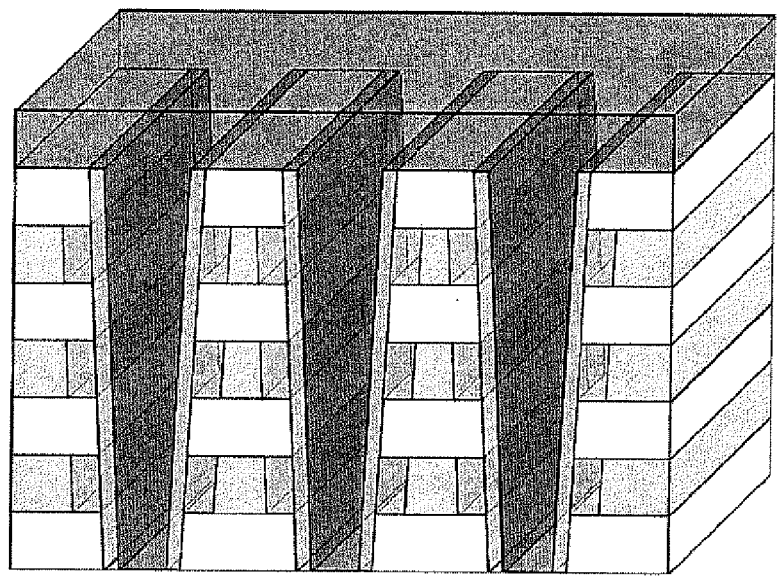
Figure 6H:
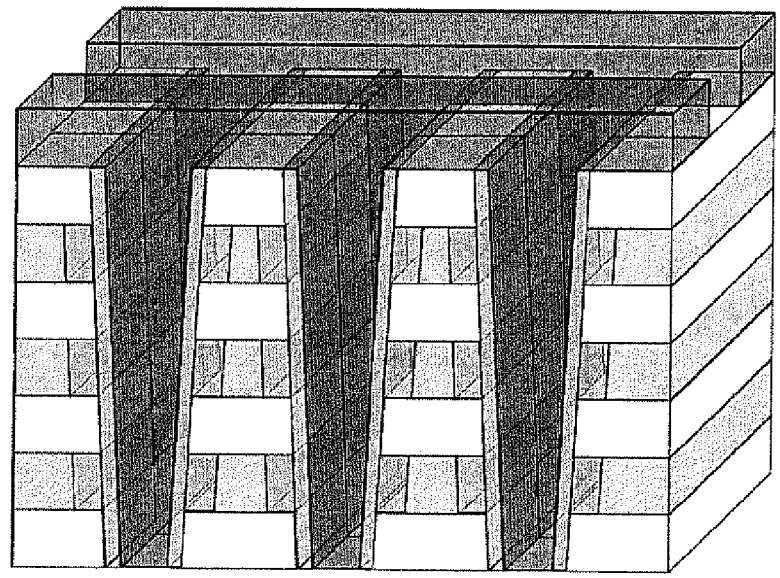
Figure 6I:
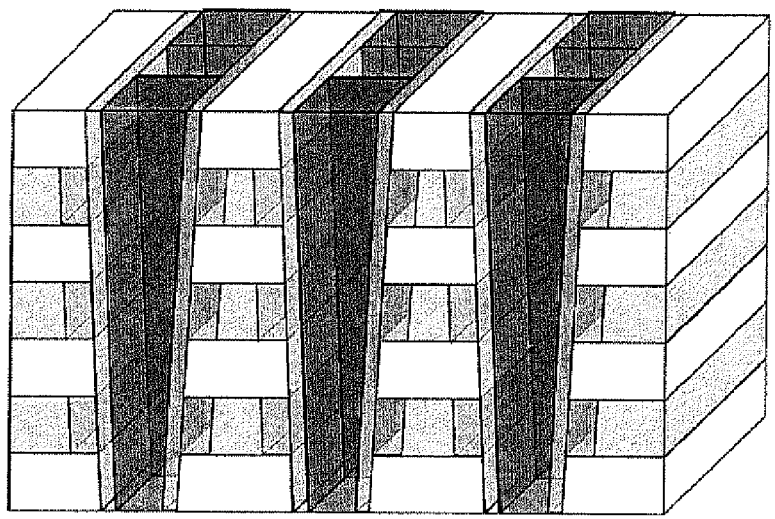

Referring to FIGS. 6G-I, vertical gate structures may be formed in the channels between the vertical stacks of memory elements. In an example, a semiconductive material may be deposited over the charge-trap layer between adjacent vertical insulation structures. In an example, a trench etch may be formed on the semiconductive material to form the vertical gate structures.

Figure 7:
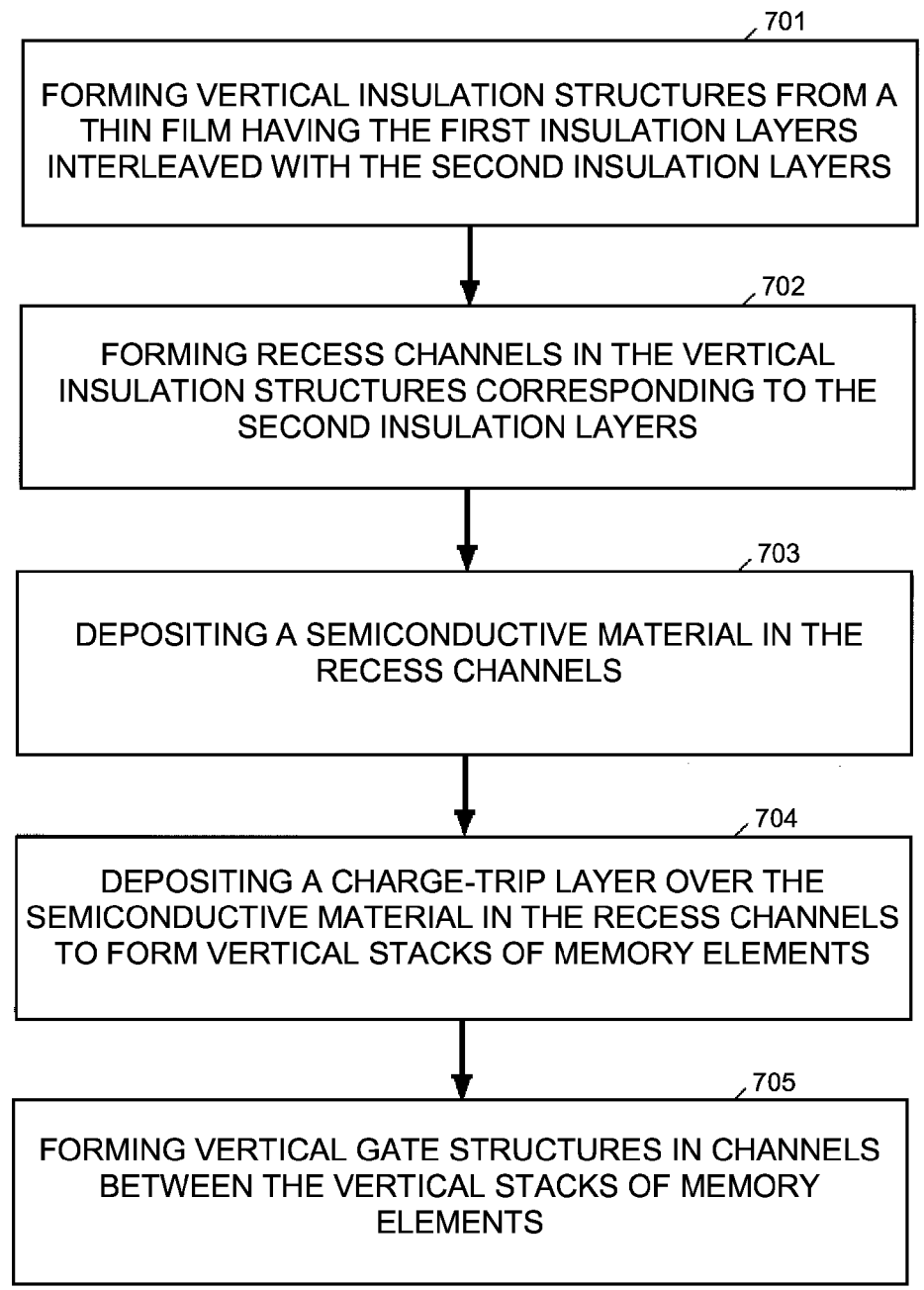
FIG. 7 is a flow chart illustrating an example process for fabricating the vertical gate NAND memory cell with isolated horizontal channel tracks.

FIG. 7 is a flow chart illustrating an example process for fabricating the vertical gate NAND memory cell with isolated horizontal channel tracks.

In block 701, vertical insulation structures may be formed from a thin film having the first insulation layers interleaved with the second insulation layers. In block 702, recess channels may be formed in the vertical insulation structures corresponding to the second insulation layers. In block 703, a semiconductive material may be deposited in the recess channels.

In block 704, a charge-trap layer may be formed over the semiconductive material in the recess channels to form vertical stacks of memory elements. In block 705, vertical gate structures may be formed in channels between the vertical stacks of memory elements.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A device comprising:
    a vertical stack of a plurality of memory cells, wherein a first memory cell of the plurality of memory cells comprises a plurality of memory elements arranged in a single layer of the vertical stack;
    a first vertical gate line coupled to a first-memory element of the plurality of memory elements in the first memory cell; and
    a second vertical gate line coupled to a second memory element of the plurality of memory elements in the first memory cell, wherein the first vertical gate line is electrically isolated from the second vertical gate line, and wherein the first memory element is electrically isolated from the second memory element by a horizontal insulation structure to store a different data state than the second memory element.

2. The device of claim 1, wherein the first memory element is separately accessible from the second memory element in the first memory cell.

3. The device of claim 1 further comprising:
a first word line positioned above the vertical stack of memory cells and perpendicular to the first vertical gate line, wherein the first word line is electrically coupled to the first vertical gate line; and
a second word line positioned below the vertical stack of memory cells and perpendicular to the second vertical gate line, wherein the second word line is electrically coupled to the second vertical gate line.

4. The device of claim 1, further comprising an array of vertical stacks including and similar to said vertical stack, wherein the memory cells in the array are configured to form memory strings, each comprising electrically connected memory cells from a row of vertical stacks of memory cells, and wherein, during a memory access operation on a selected one of the memory strings, any unselected memory cells in the selected memory string have their respective memory elements turned on by voltages on vertical gate lines coupled to the unselected memory cells.

5. The device of claim 4, wherein, during the memory access operation on the selected memory string, a selected memory cell in the memory string is configured to have an unselected memory element turned off and a selected memory element set to a memory access voltage by voltages on vertical gate lines coupled to the respective memory elements of the selected memory cell.

6. A device comprising:
a vertical stack of a plurality of memory cells, wherein a first memory cell of the plurality of memory cells comprises a plurality of memory elements arranged in a single layer of the vertical stack and a horizontal insulation structure between the plurality of memory elements in the single layer to electrically isolate a first memory element of the plurality of memory elements in the first memory cell from a second memory element of the plurality of memory elements in the first memory cell; and
a plurality of vertical gate lines, each coupled to corresponding ones of the plurality of memory elements in the first memory cell.

7. The device of claim 6, wherein the plurality of vertical gate lines comprise first and second vertical gate lines electrically isolated from each other.

8. The device of claim 7 further comprising:
a first word line positioned above the vertical stack of memory cells, wherein the first word line is electrically coupled to the first vertical gate line; and
a second word line positioned below the vertical stack of memory cells, wherein the second word line is electrically coupled to the second vertical gate line.

9. The device of claim 6, wherein the plurality of memory elements are configured to store respective data states.

10. The device of claim 6, wherein the first memory element is separately accessible from the second memory element.

\* \* \* \* \*

UNITED STATES PATENT AND TRADEMARK OFFICE
CERTIFICATE OF CORRECTION

PATENT NO.       : 9,570,459 B2                          Page 1 of 1
APPLICATION NO.  : 14/314622
DATED            : February 14, 2017
INVENTOR(S)      : Bruce Lynn Bateman It is certified that error appears in the above-identified patent and that said Letters Patent is hereby corrected as shown below:

In the Claims

Claim 1, Column 4, Line 59 please delete "-"

Signed and Sealed this
Twenty-sixth Day of June, 2018

Andrei Iancu
*Director of the United States Patent and Trademark Office*